United States Patent
Malm

(10) Patent No.: US 7,213,189 B2
(45) Date of Patent: May 1, 2007

(54) METHOD FOR ITERATIVE DECODER SCHEDULING

(75) Inventor: Peter Malm, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 10/520,044

(22) PCT Filed: Jun. 27, 2003

(86) PCT No.: PCT/EP03/06798

§ 371 (c)(1),
(2), (4) Date: Sep. 19, 2005

(87) PCT Pub. No.: WO2004/004127

PCT Pub. Date: Jan. 8, 2004

(65) Prior Publication Data

US 2006/0023815 A1      Feb. 2, 2006

Related U.S. Application Data

(60) Provisional application No. 60/394,320, filed on Jul. 8, 2002.

(30) Foreign Application Priority Data

Jul. 1, 2002    (SE) .................................... 0202035

(51) Int. Cl.
*H04L 1/18*    (2006.01)
(52) U.S. Cl. ...................... 714/748; 714/749
(58) Field of Classification Search ...................... None See application file for complete search history.

(56) References Cited

U.S. PATENT DOCUMENTS

| 3,676,846 A | * | 7/1972 | Busch | .......................... 714/749 |
| 3,754,211 A | * | 8/1973 | Rocher et al. | .............. 714/749 |
| 3,879,577 A | * | 4/1975 | Progler | ...................... 178/23 A |

(Continued)

FOREIGN PATENT DOCUMENTS

| EP | 0 973 292 A | 1/2000 |
| WO | WO 02/21757 A | 3/2002 |

OTHER PUBLICATIONS

Hui Zhao, et al.; "A hybrid-ARQ protocol with adaptive rate error control"; Proceedings Tencon 1993; 1992 IEEE Region 10 Conference on Computer Communication, Control and Power Engineering; pp. 108-112, vol. 3, New York, NY.

(Continued)

*Primary Examiner*—Guy Lamarre
*Assistant Examiner*—Steven D. Radosevich
(74) *Attorney, Agent, or Firm*—Michael G. Cameron, Esq.

(57) ABSTRACT

A method for scheduling a decoding process of coded data blocks transmitted over a link in a communication network. According to the method the coded data block is stored in a queue (71) if all decoders of a cluster (72) of iterative parallel decoders are unavailable. When any of the decoders of the cluster (72) is available the first coded block of the queue (71) is moved to that decoder. Also, according to the method it is possible to combine a stored coded block with a retransmitted coded block, which is decoded with an increased probability for successful decoding. Also, the invention relates to a communication apparatus adapted for carrying out the method according to the invention.

34 Claims, 5 Drawing Sheets

U.S. PATENT DOCUMENTS

| | | | | |
|---|---|---|---|---|
| 4,521,848 | A | * | 6/1985 | Bruce et al. .................. 714/43 |
| 4,888,800 | A | * | 12/1989 | Marshall et al. ............ 380/281 |
| 6,252,917 | B1 | * | 6/2001 | Freeman .................... 375/340 |
| 6,496,481 | B1 | * | 12/2002 | Wu et al. ................... 370/242 |
| 6,519,731 | B1 | * | 2/2003 | Huang et al. ............... 714/751 |
| 6,704,898 | B1 | * | 3/2004 | Furusk ar et al. ........... 714/751 |
| 2001/0034209 | A1 | * | 10/2001 | Tong et al. .................. 455/69 |
| 2003/0081553 | A1 | * | 5/2003 | Bitar .......................... 370/236 |
| 2003/0126514 | A1 | * | 7/2003 | Shabbir Alam et al. ...... 714/43 |
| 2003/0174662 | A1 | * | 9/2003 | Malkamaki ................ 370/310 |

OTHER PUBLICATIONS

Zhao Suli; "The applications of retransmission schemes in the radio Interface of mobile communication systems": Fifth Asia-Pacific Conference on Communications and Fourth Optoelectronics and Communications Conference: APCC/OECC 1999 Proceedings; Conference—Vitality to the new Century, pp. 500-503, vol. 1, Beijing, China, Beijing Univ, Posts & Telecommun., China.

European Patent Office: PCT International Search Report for PCT/EP03/06798 dated Mar. 11, 2003.

* cited by examiner

METHOD FOR ITERATIVE DECODER SCHEDULING

This patent application claims the benefit of priority from U.S. Provisional Patent Application Ser. No. 60/394,320 filed on Jul. 8, 2002. This application incorporates by reference the entire disclosure of U.S. Provisional Patent Application Ser. No. 60/394,320.

TECHNICAL FIELD OF THE INVENTION

The present invention relates to communication systems where decoders are used to decode an incoming stream of data blocks. More specifically, the method according to the invention relates to a way of scheduling the data blocks to a number of iterative channel decoders in a cluster for minimizing the number of decoders needed for a certain bitstream. Also, the present invention relates to an electronic communication apparatus comprising a number of decoders, which is adapted to the method of the invention.

DESCRIPTION OF THE PRIOR ART

An electronic communication apparatus as set out above can for instance be a mobile or cellular telephone i.e. for UMTS ("Universal Mobile Telecommunication System"), a communicator, an electronic organizer, or a smartphone.

In the evolution of WCDMA ("Wide-band Code Division Multiple Access") a new concept called High Speed Downlink Packet Access (HSDPA) has been proposed, which features a High Speed Downlink Shared Channel (HS-DSCH). One main feature of HSDPA is the introduction of an ARQ-protocol on the physical layer (Layer 1, L1), i.e below the Radio Link Control (RLC) protocol, may apply an ARQ-protocol for error correction.

The ARQ-protocol in HSDPA is introduced at L1 to avoid RLC retransmissions introducing considerable Round Trip Time (RTT). In addition to being large, the RLC-induced RTT varies in-length. The result is that higher-layer protocols, in particular TCP, degrades the end-to-end throughput of the transmission link as a result of the large and varying RTT.

The new ARQ-protocol introduced on L1 is intended to correct the majority of the channel errors before they trigger RLC-retransmissions. The end-to-end throughput is then preserved since TCP experiences a less varying, and shorter, RTT. However, it is a prerequisite that the RTT of HS-DSCH on L1 is as small as possible. One large contributor to the RTT is the iterative decoding process in the electronic communication apparatus. Consequently, it is preferred that the decoding process is as fast as possible.

The HSDPA mode features downlink bitrates up to 15 Mbps conveyed by turbo-coded data packets. This implies that more than one decoder may have to be employed in the electronic communication apparatus for decoding the high bitrate. However, an iterative decoder implementation is quite large and expensive. Every additional decoder adds complexity to the communication apparatus and demands a lot of chip area.

To be able to fully handle the bitrates of HSDPA, up to 10 decoders are needed if a conventional decoding technique is used. As the iterative decoding process of the mobile telephone can be a large contributor to the RTT, each additional decoder may significantly increase the RTT of the decoding process. Also, each additional decoder will increase the cost and the power consumption of the communication apparatus.

SUMMARY OF THE INVENTION

It is an object of the present invention to provide a method for implementing a decoder process being capable of decoding an incoming stream of coded data blocks received with a high bitrate. More specifically, it is an object of the method according to the invention to minimize the number of decoders required for receiving the high bitrate of data blocks and optimizing the utilization of the decoders.

Further, it is an object of the method according to invention to reduce the complexity, power consumption, and cost of the decoder implementation of an electronic portable communication apparatus.

Another object of the invention is to provide an portable electronic communication apparatus adapted for decoding an incoming stream of data blocks, which are received with a high bitrate. Also, it is an object of the invention to provide an apparatus having low decoder complexity, low power consumption, and low cost, and which utilizes the decoders efficiently.

The above objects have been achieved by a method, according to which it is possible to store an incoming data block in a queue, if all decoders of a cluster of iterative decoders are unavailable. The first decoder being available takes on the first data block in the queue. Further, the data block is transmitted according to a HARQ-protocol, which provides the possibility to store unsuccessfully decoded data blocks. Therefore, an unsuccessfully decoded data block is moved to the end of the queue and combined with a retransmitted block of data before processed in any of the decoders of the cluster once again. The storing, combining, and decoding process proceeds until an ACK-report can be communicated to a transmitter of the coded data block.

By scheduling the received blocks according to the method of the invention it is possible to minimize the number of decoders required for a certain received bitrate. Specifically, according to the inventive method the high-speed bitrate associated with HSDPA can be received and decoded with fewer decoders, preferably two or three, than would be the case if the decoder-count was dimensioned for the worst case. The worst case is when all received blocks are iterated in the decoder a maximum number of iterations even if a CRC (cyclic redundancy check) checks after a few iterations. According to the invention, CRC is checked after each decoder iteration and further iterations are canceled as soon as the CRC checks. In this way, the decoder utilization is enhanced compared to if the maximum number of iterations is done. Consequently, the number of decoders that needs to be deployed for a certain bitrate can be minimized.

The above objects are also achieved by an electronic communication apparatus capable of decoding data blocks received over a wireless link in a communication network. The inventive apparatus comprises a queue, which is adapted for temporarily storing the data blocks, and a cluster of decoders, which is adapted to decode the data blocks when any of the decoders of the cluster is available. Advantages of the apparatus according to the invention are low complexity, low cost, and low power consumption.

Further preferred features of the invention are defined in the dependent claims.

It should be emphasized that the terms "comprises/comprising" when used in this specification is taken to specify the presence of stated features, integers, steps or components but does not preclude the presence or addition of one or more other features, integers, steps, components or groups thereof.

BRIEF DESCRIPTION OF THE DRAWINGS

A preferred embodiment of the present invention will now be described in more detail with reference to the accompanying drawings, in which.

DETAILED DESCRIPTION OF EMBODIMENTS

Figure 1:
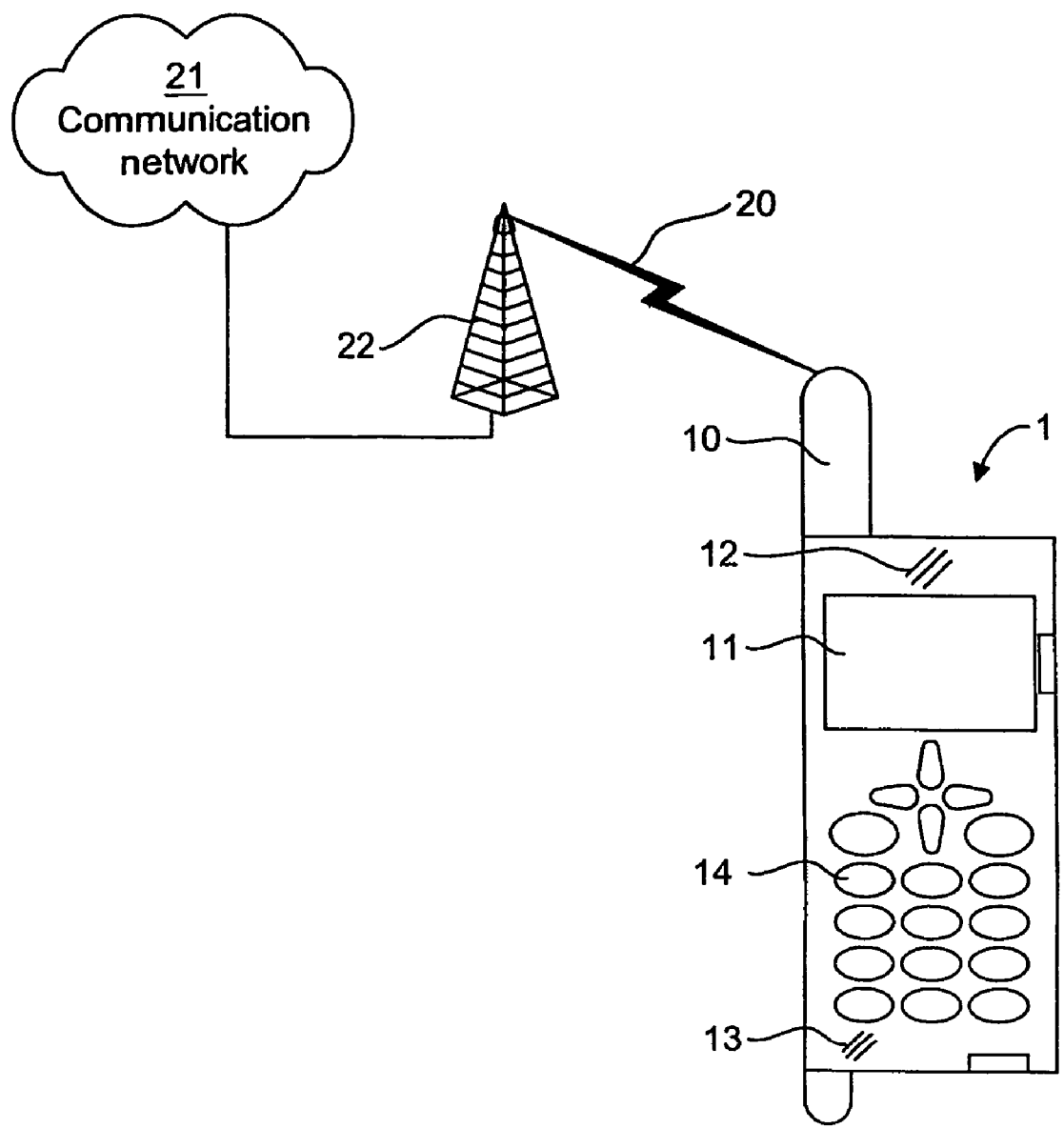
FIG. 1 shows a mobile telephone according to the present invention operatively connected to a communication network.

FIG. 1 is intended to illustrate a portable communication apparatus embodied as a mobile telephone 1, in which the present invention is incorporated. The mobile telephone 1 comprises an antenna 10, which in a conventional way is used for connecting the mobile telephone 1 to a communication network 21, over a wireless link 20, through a base station 22. In a well-known way, the communication network 21, for instance a UMTS network, offers voice, data and fax call services to the user of the mobile telephone 1. Also, the mobile telephone 1 may have access to additional applications such as internet/intranet, videoconference, news push, networked games and video telephone through the communication network 21. Furthermore, the mobile telephone 1 is adapted to receive (e.g. from a transmitter of the base station 22) and decode an incoming stream of data block having a bitrate of up to 15 Mbps. According to the method of the invention, the received data blocks are put in a queue and then scheduled on a pool of decoders, as will be described in the following.

Further, the mobile telephone 1 comprises a display 11, a loudspeaker 12, a microphone 13 and a keypad 14, all in a well-known way for creating an interface for using the mobile telephone 1.

Further, the mobile telephone 1 comprises a receiver and a transmitter for exchanging data with the communication network 21 through the base station 22.

The mobile telephone 1 and the communication network 21 support High Speed Downlink Packet Access (HSDPA), which features downlink bitrates up to 15 Mbps conveyed as turbo-coded packets.

Figure 2:
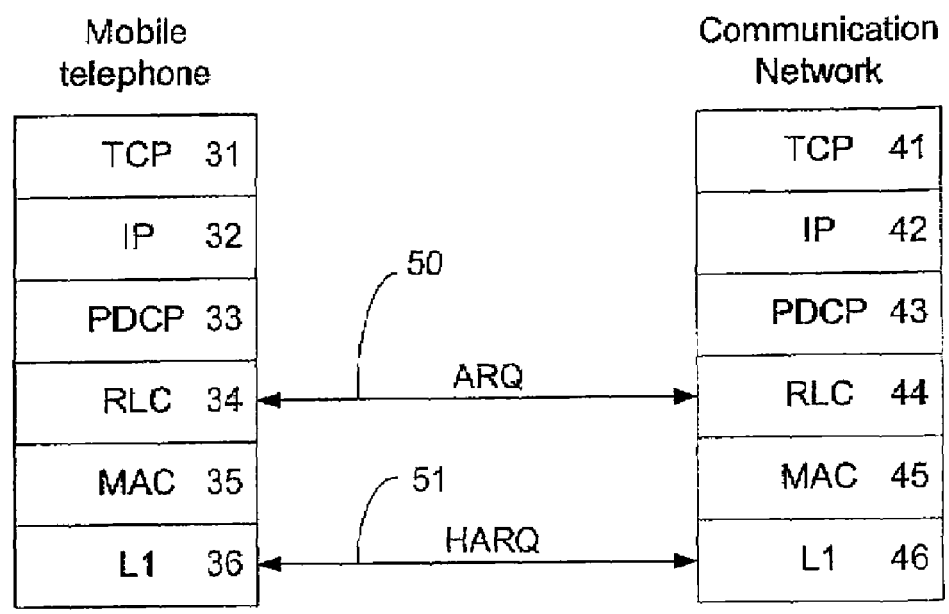
FIG. 2 is a schematic diagram of a structure of a stack of protocols in the mobile telephone and the communication network, respectively.

FIG. 2 shows a simplified stack of protocols 31–35 for WCDMA, which are arranged in the mobile telephone 1. As is also shown in FIG. 2, the communication network 20 comprises in a similar fashion a stack of protocols 41–46 corresponding to the protocols 31–36 of the mobile telephone 1. The protocols 31–36 and 41–46 facilitate the exchange of data with the high bitrate between the mobile telephone 1 and the communication network 21, as is well known and will not be further discussed herein.

An RLC protocol 33, 43 provides, at least in acknowledged mode, ARQ-functionality 50 between peers, that is between the RLC layers 24, 44 of the mobile telephone 1 stack and the communication network 21 stack respectively, as is indicated by a first two-way arrow in FIG. 2.

Further, a second ARQ-protocol 50 is provided between the physical layers (layer 1, L1) 36, 46 of the mobile telephone 1 and the communication network respectively, indicated by a second two-way arrow in FIG. 2. More specifically, the physical layer of the communication network 21 is situated at the base station 22 in FIG. 1. The second ARQ-protocol 50 controls the transmission of data between the base station 22 and the mobile telephone 1. This second ARQ-protocol provides Hybrid ARQ (HARQ) functionality. The HARQ-protocol 51 allows the mobile telephone 1 a certain processing time, and the received coded data blocks 61, 63 can therefore be stored in a queue 71 while they await decoding in any of the decoders in a decoder pool 72. The data blocks 61, 63 represents various types of coded data, e.g. voice, video and data, which will be further-disclosed in the following. Also, if the decoding fails, the HARQ-protocol 51 requires a NACK (Not ACKnowledged) report to be sent to a receiver in the base station 22. The NACK information is then conveyed to a HARQ-controller in the base station, which retransmits the failed blocks 62. Meanwhile. the data block 61, 63 that was unsuccessfully decoded can be stored in a memory of the mobile phone 1 for subsequent combining with a retransmitted data block 62 from the base station 22. This will be discussed further below. By sending ACK/NACK reports between the L1 36, 46 of the mobile phone 1 and the base station 22, respectively, channel errors can be corrected without involving the ARQ-protocol 50 of the RLC-layer 34, 44. This stabilizes the RTT on the RLC-level.

Figure 3:
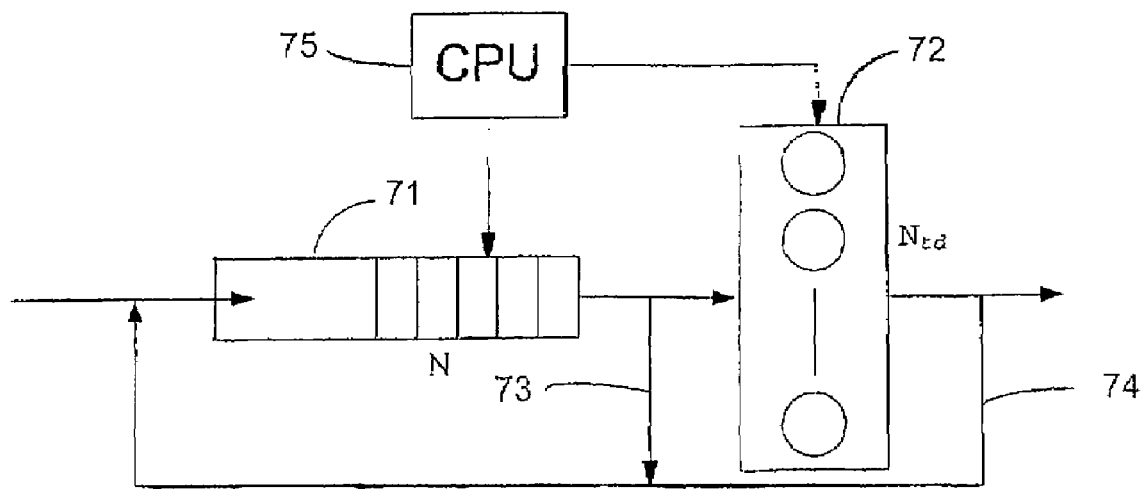
FIG. 3 is a block diagram of a queue and a cluster of decoders arranged according to the invention.

FIG. 3 illustrates a decoder implementation according to the present invention. A local memory, such as a RAM memory or a flash memory, is provided in the mobile telephone 1 for implementing a queue 71 for temporarily storing the data blocks 61, 63 awaiting decoding, and possibly combining with a retransmitted data block 62. The queue 71 can be administrated and controlled by a central processing unit 75 (CPU) implemented by any commercially available microprocessor, or another type of programmable logic circuitry. Therefore, the CPU 75 is connected to the queue 75.

The queue 71 is connected to a cluster 72 of decoders having a number ($N_{td}$) of individual decoders, which are arranged in a parallel configuration. By arranging the decoders in parallel, each decoder can receive a complete coded data block 61, 63 and process it independently of all the other decoders of the cluster 72. In this embodiment, preferably two or three turbo-decoders are utilized. However, any number of iterative decoders, which can be arranged in parallel, can be provided in the cluster 72 and implemented according to the present invention. As a consequence of the parallel arrangement of the decoders it is possible to shut off some of the decoders when the bit rate does not demand service from all decoders, and thus power can be saved. This and the overall control of the queue 71 and the decoder cluster 72 will be handled by the CPU 75. Consequently, the CPU 75 is also connected to the decoder cluster 72.

Further, two feedback-loops 73, 74 provide the possibility to move the first data block 61, 63 of the queue 71 or a data block 61, 63 in the cluster 72 of decoders, respectively, to the queue 71 if either the HARQ protocol demands an ACK/NACK-report and the block 61, 63 has not been tried on the decoder, or if the block 61, 63, is in the process of decoding but it has not passed CRC (cyclic redundancy check) yet.

In the UMTS-standard the encoder architecture type used is referred to as Parallel Concatenated Convolutional Code. In the UMTS-specification the encoder comprises two 8-state constituent encoders and one interleaver. Data coded according to this standard can be decoded using an iterative decoding technique, such as a turbo decoder implementation. The service time in an iterative decoder is random, which makes it advantageous to cluster a set of decoders.

Figure 4:
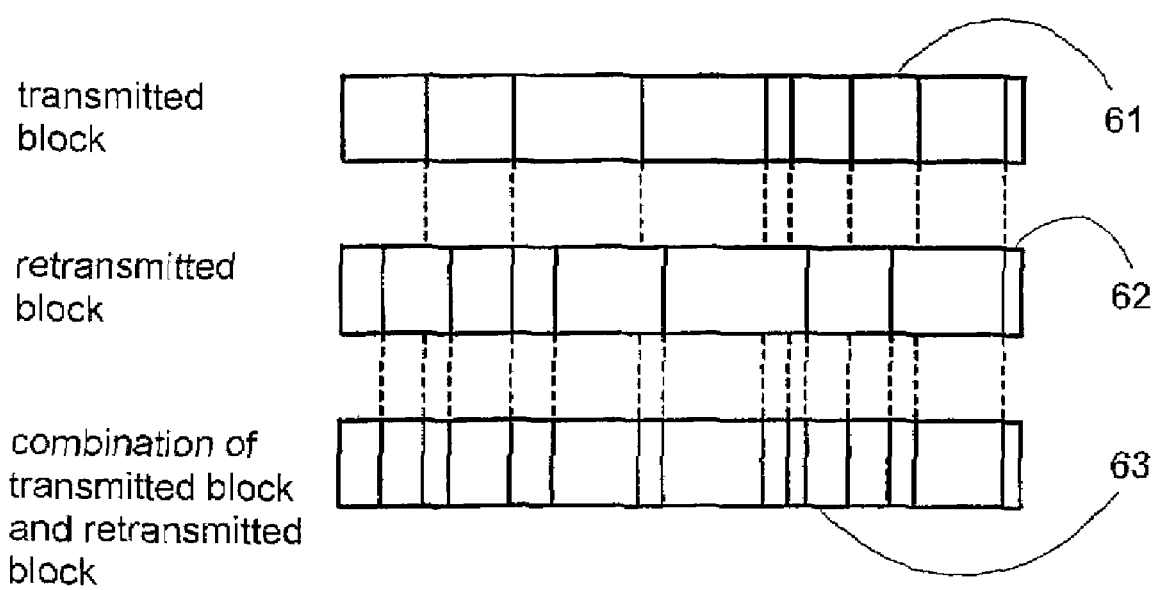
FIG. 4 illustrates three different coded data blocks.

FIG. 4 illustrates the coded data block 61, relating to a bit stream representing data such as voice, video, fax etc., which is input to a transmitter. The data block 61 will be decoded by any of the decoders of the cluster 72. Also, a retransmitted coded data block 62, and a combined coded data block 63, which is also to be decoded by any of the decoders of the cluster 72, is illustrated. The lines of the blocks 61, 62, 63 correspond to coded bits of said blocks. However, it should be noted that there usually are much more bits in a coded block than indicated in FIG. 4, as the blocks of FIG. 4 merely are illustrative. The retransmitted data block 62 relates to the same information bits as the first data block 61. The combined data block 63 comprises the bits of the first and retransmitted data blocks 61, 62. The first data block 61 comprises certain coded bits, indicated by lines in the first data block 61 in FIG. 3. Also, the retransmitted data block 62, which relates to the same information bits as the first data block 61, may comprise other coded bits that are indicated by lines in the second data block 62 in FIG. 4.

The retransmitted data block 62 is combined with the stored first data block 61 upon reception by, e.g., summing the loglikelihood ratios of the received coded bits. As is understood, there may be more than one retransmission where each retransmitted block may necessarily not comprise the same coded bits. The combination forms the combined data block 63, which may contain more coded bits than data blocks 61 and 62, respectively. However, some coded bits may overlap between block 61 and 62, which is indicated by lines in the third data block of FIG. 3. When the combined data block 63 is formed, it replaces the first data block 61 in the queue 71. Thereafter it is ready for decoding in any of the decoders of the cluster 72. A combined data block 63 being unsuccessfully decoded can once again be combined with a retransmitted data block for subsequent decoding.

The combination of data blocks 61, 62, 63 has the advantage that the probability of correct decoding increases in many cases, depending on the radio channel conditions, with every retransmission and combination.

The data block 61, 63 currently undergoing the decoding process can be checked after each iteration for errors by e.g. a CRC (Cyclic Redundancy Check) sequence. According to the invention, CRC is checked after each decoder iteration and further iterations are canceled as soon as the CRC checks. The probability that the data block is error-free increases fast with the number of iterations. However, it should be noted that if the decoding of the data blocks 61, 63 is not successfully completed after about 3 iterations it is unlikely that the decoding will succeed without a retransmission. As a consequence of this, the iterative decoding process of the present invention can be aborted prematurely at any stage of the decoding. Instead, the processed data block 61, 63 can be stored in the queue 72 and a retransmission of the data block 61, 63 is requested by the mobile telephone 1 by transmitting a NACK-message to the base station 22.

If the maximum number of iterations is reached, the iterative process of the decoder is unconditionally aborted and the data block 61, 63 presently undergoing decoding is moved to the back of the queue 72 and a retransmission of the data block 61, 63 is requested. The retransmitted data block can then be combined with the locally stored data block 61, 63, as set out above, before decoding of the combined block 63 commences, which increases the probability for correct decoding.

A method for scheduling the decoders of a mobile telephone 1 according to the invention will now be explained in detail.

The scheduling method according to the invention combine the possibility to retransmit data blocks 62 and the possibility to abort the iterative decoding process of a data block 61,63 undergoing processing. Also, it is possible to shut off some of the decoders of the cluster 72 as discussed above. This will make use of the iterative decoder resources of the mobile telephone 1 as efficiently as possible. FIG. 3 shows a schematic block diagram of the queue 71 and the cluster 72 of decoders. A number of turbo decoder are utilized in this embodiment, preferably two or three decoders, for the 15 Mbs bitrate data stream. The HARQ-protocol 51 on L1 46 of the transmitter of the base station 22 requires the decoding to be finished within a predetermined time-period, after which said transmitter requires an ACK/NACK-report of the decoding process from the receiver of the mobile telephone 1.

Figure 5:
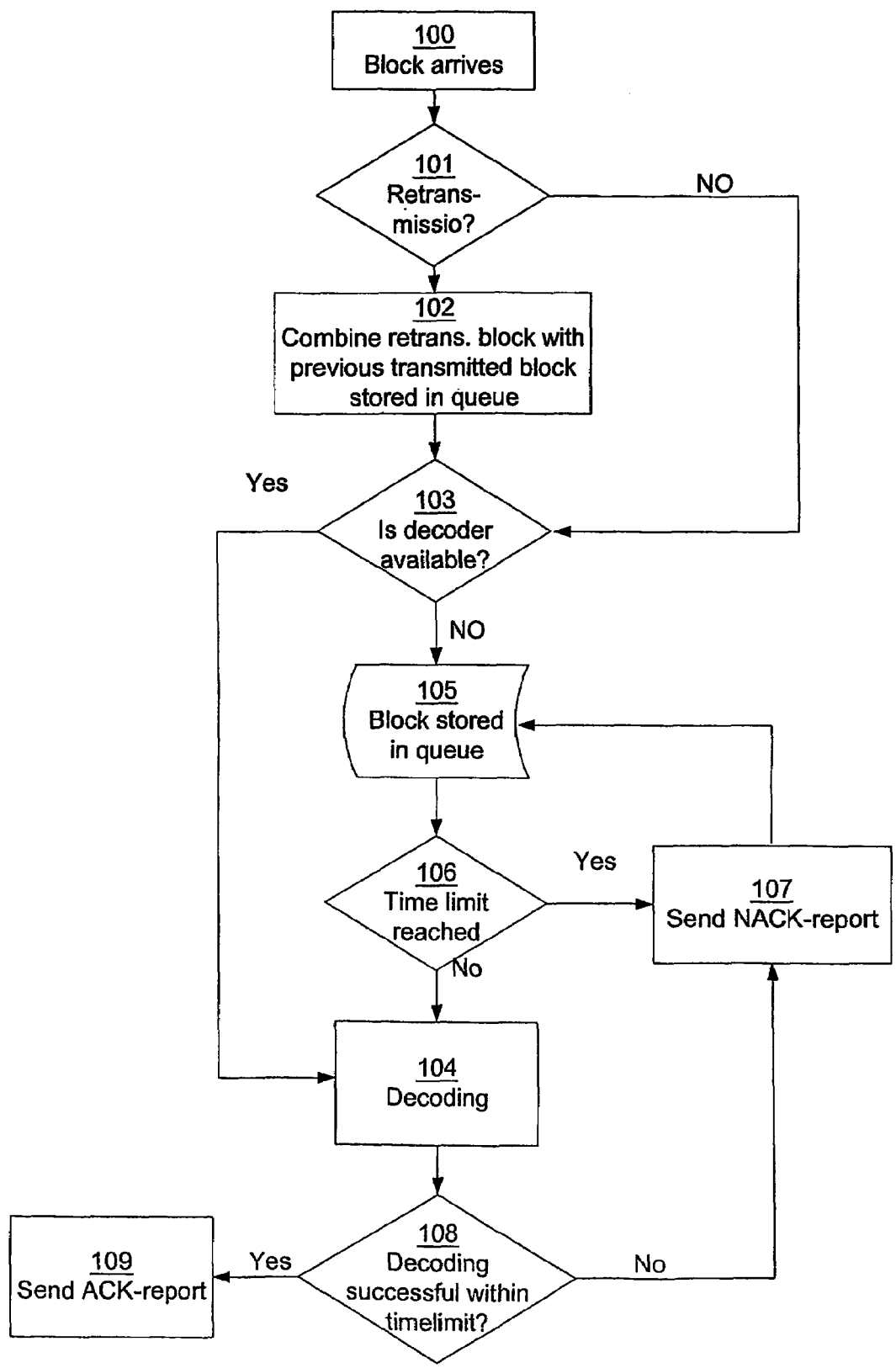
FIG. 5 is a flowchart of the scheduling of the decoding process according to the present invention.

Reference is now made to FIG. 5, illustrating in a block diagram the possible scheduling and processing of the data blocks 61, 63 awaiting decoding. First, the data block 61 is received at 100 by the receiver of the mobile telephone 1 and stored in the queue 1. Depending on the queuing time it is decided at 102 whether a retransmission is necessary. If so, a retransmission occurs, and the retransmitted block 62 and the queued block 61 are then combined at 102 to a combined block 63 and further processed at 103. If retransmission is not necessary, the coded data block 61 is transferred directly to 103, where it is determined whether any decoder is available. If so, the block 61, 63 is moved to any of the decoders being available for decoding at 104. Otherwise, the data block 61 is moved to the queue at 105.

If the block 61 is stored at 105, it is determined at 106 whether the time limit is reached before the data block 61, 63 is moved to-any of the decoders. The outcome of this determination results in four different cases:

In the first case, if the time limit is reached before any decoder is available, the data block 61, 63 is moved to the end of the queue 72, as is also indicated by the first feedback-loop 73 of FIG. 3. Also, an NACK-report is sent at 107 to the transmitter of the base station 22, which triggers a transmission of the retransmitted data block 62.

In the second case, if the time limit is not reached, the data block 61 is moved to any of the decoders of the cluster 72 for decoding at 104. Then, it is determined whether the decoding is successful within the time limit at 108. A successful decoding will trigger an ACK-report at 109 to be transmitted from the mobile telephone 1 to the transmitter of the base station 22.

In a third case, if it is determined at 108 that the decoding at 104 is not finished (i.e. unsuccessful decoding) within the time limit, a NACK-report is transmitted at 107 to the transmitter of the base station 22. Also, the data block 61 is moved to the end of the queue 71, which is indicated with the second feedback loop 74 in FIG. 3.

In the fourth case, if it is determined at 108 that the data block 61 is unsuccessfully decoded, or the maximum number of iterations is reached, within the time limit, and a NACK-report is transmitted at 107 from the mobile telephone 1 to the transmitter of the base station 22. Also, the data block 61 is moved to the end of the queue 71, as is indicated with the second feedback loop 74 in FIG. 3.

It should also be noted that it is possible to abort the decoding process at 104 prematurely, such as after 2–3 iterations as discussed above, in case the CRC checks.

If a data block 61 is moved to the end of, and stored in, the queue 71, the combination with the retransmitted block 62 to a combined block 63 occurs during the queuing. Then the combined block 63 is processed according to the steps 106, 107, 104, 108 until the decoding is successfully completed and the ACK report is transmitted at step 108.

In case a failed decoding is likely then it may be preferred to interrupt the iterative process in the decoder, and instead request a retransmission. After a fast retransmission from the base station 22 the retransmitted data block 62 can be combined with the data block 61 stored in the queue 71 and the combined data block 63 can be decoded instead. In most cases the performance with a quite small number of iterations, preferably 1–3, is satisfactory, and the scheduling method according to the invention exploit this possibility by automatically adapting, i.e. increasing or decreasing, the maximum number of iterations ($N_{iter}$) in the decoders depending on the bitrate received. Therefore, the scheduling of the decoding process according to the invention provides the possibility to support high bit rates with a limited number of decoders.

If the decoding of the data blocks 61, 63 are unsuccessful, or the data blocks 61, 63 is not moved to any of the decoders within the time limit, the data blocks 61, 63 will be moved to the back of the queue 71 as set out above. When the transmitter of the base station 22 receives the ACK/NACK-report it determines weather to retransmit a specific data block 61, 63 (NACK) or transmit a new block (ACK). If a NACK-report is received a data block 62 will be prepared and transmitted to the mobile telephone 1. When the retransmitted data block 62 is received by the mobile telephone 1, the retransmitted data block 62 is combined with the stored data block 61, 63 to a combined data block as set forth above. This combined data block 63 has an improved probability of being successfully decoded, as the combined block 63 comprises more energy and/or parity bits. A data block 61, 63 can be combined several times, whereby the probability for successful decoding increases after each combination.

An important feature of the present invention is if many data blocks 61, 63 fail to reach the cluster 72 of decoders before they are moved to the back of the queue 71. In such a case, the maximum number of allowed iterations $N_{iter}$ of the decoders could be decreased automatically, e.g. by the CPU 75. In this embodiment, the adaptation of the maximum number of iterations in each decoder is changed automatically by the CPU 75 when the number of blocks 61, 63 being moved from directly from the beginning of the queue 71 to the end of said queue 71 reaches predefined indices. However, as is realized by the man skilled in the art the adaptation is not necessary at all or can be implemented differently. This results in decreased probability of correctly decoded data blocks 61, 63, but it also decreases the decoding time, i.e. more data blocks 61, 63 can be tried on the cluster 72 of decoders per time unit. The optimum number of iterations $N_{iter}^{opt}$ in each decoder of the cluster 72, and the indices, is a design parameter, which can be set differently depending on the current link 20 quality as well as on the mobile telecommunication network 21 operator's preferences.

The maximum number of iterations of a certain decoder of the cluster of decoders 72 may also be automatically adapted in dependence on the type of coded data block that is received by said decoder for decoding. If the received data block is to be decoded for the first time, i.e. it is not a combined data block, the maximum number may be set to a first number of iterations, such as eight. However, if the received data block is a combined data block 63, the maximum number of iterations may be set to a second number of iterations, such as 1–4. A combined data block has increased probability of successful decoding. Thus, if the combined data block is not successfully decoded after the second number of iterations, it will probably not be decoded successfully. The first and second maximum number of iterations has the advantage that the throughput of the cluster of decoders will increase.

Figure 6:
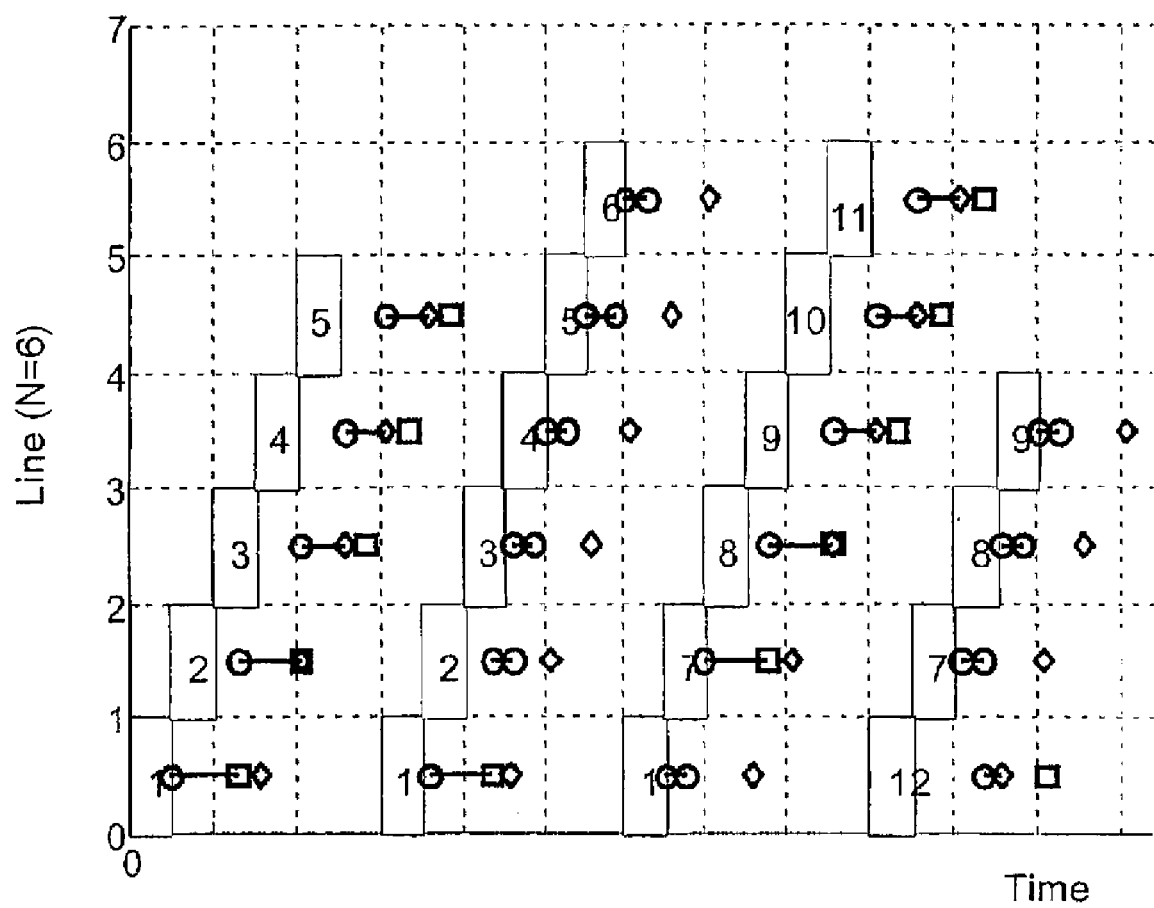
FIG. 6 is an exemplifying timing diagram of the decoding process according to the invention.

FIG. 6 shows a simulation of a decoding operation when a N-staggerd Stop and Wait protocol with N=6 different lines is used for simulating the HARQ-protocol 51 on L1 36, 46. The scheduling scheme for the decoding process according to the invention is utilized with one decoder. The offered bitrate is 2.88 Mbps and the code rate is R=0.5 in an AWGN ("Additive White Gaussian Noise") channel. For simplicity, only one decoder is used. However, as discussed previously in this document it may be necessary to provide more than 1 decoder to support a bitrate of up to 15 Mbps.

In FIG. 6 the decoding time, which includes a number of iterations, is outlined by a line starting with a circle. The time limit when it is necessary to send the ACK/NACK-report to the transmitter is marked by a rhomb. A successful decoding is marked by a circle after the line, while an unsuccessful decoding is marked by a square.

When the receiver of the mobile phone 1 receives the data blocks 61, they are stored in the queue 71 if no decoder is available. As can be seen in FIG. 6, the first arriving data block 61 can be directly moved to the decoders without intermediate storing in the queue 71. The storing is symbolized by a gap between the starting circle and the completed reception of the data block 61, 63. However, at the time data blocks number 2–6 are received, the decoder is not available and consequently the data blocks 61 have to be stored in the queue 71. The data blocks 61 are then fed to the decoder according to an "oldest-first" rule.

The decoding of the first data block 61 is finished within the time limit but is unsuccessful. Consequently, a NACK-report is transmitted to the transmitter of the base station 22, and the data block 61 is moved to the end of the queue 71. Said transmitter receives the NACK-report and prepares and retransmits the first data block as a retransmitted data block 62. This corresponds to the fourth case of FIG. 5.

The decoding of the third data block 62 is not finished within the time limit, and a NACK-report is sent to the transmitter. This corresponds to the third case of FIG. 5.

The first case of FIG. 5, i.e. the data block 61 is not moved to the decoder within the time limit, occurs the first time the sixth data block of FIG. 6 is to be decoded. As FIG. 6 discloses the operation of the decoder, the sixth data block 61 is not present in FIG. 6 during the first round of its intended decoding. However, a NACK-report is transmitted to the transmitter of the base station 22, which triggers a retransmission. Therefore, the first time the sixth data block appears it is a combined data block 63.

Finally, the second case of FIG. 5, i.e. the decoding is successful within the time limit, occurs when the second data block has been combined with a retransmitted data block 62, and the combined data block 63 is decoded for the first time. Consequently, an ACK-report is transmitted to the transmitter of the base station 22, which then can transmit a seventh data block 61 over line two.

In the embodiment for the simulation result of FIG. 6, the "oldest first" rule is used, i.e. priority is given to the data block 61, 63 in the queue having the longest waiting time. This result in that the sixth data block in FIG. 6 is skipped in the first round, as discussed above. However, in another embodiment it is equally well possible to move the data blocks 61, 63 from the queue to the decoders according to any other principle, e.g. Last in First Out (LIFO), as long as the data block 61, 63 has been combined with a retransmitted data block 62.

From FIG. 6 it is evident that the scheduling method according to the invention optimizes the usage of the decoders, i.e a decoder is never idle as long as there are more data blocks 61, 63 in the queue 71 waiting for decoding. However, if some decoders become idle, or when the number of blocks 61, 63 in the queue 71 is low, it is possible to automatically shut off any of the decoders in order to save power. Consequently, if the number of blocks in the queue 71 becomes too large, a non-active decoder can be activated automatically. In this embodiment, a controller, such as CPU 75, automatically handles the activation of the decoders. For example, any of the decoders can be activated/deactivated when the received bitrate reaches a certain predefined level. The level is a design parameter, which is based on e.g. in operator preferences in each particular case. However, as is realized by the man skilled in the art this activation/deactivation is not necessary or can be implemented differently. In the embodiment shown $N_{iter}=15$ was chosen as an example, and as a result some data blocks will expire and be transmitted to the back of the queue 71 before they reach the decoder. However, any other reasonable number of iterations in the decoders is equally well possible within the scope of the invention.

As is understood, the overall operation of the mobile telephone and the exchanging of data blocks 61, 62 are well known in the art and therefore will not be further discussed in this document. The operation of the queue 71 and the cluster of the decoders, such as queue handling and adaptation of the number active decoders and their respective maximum number of iterations in the decoders can be provided by the same CPU 75, which can be any commercially available microprocessor or programmable logic circuitry.

The invention has been described above with reference to some embodiments. However, other embodiments than the ones referred to above are equally well possible within the scope of the invention, which is best defined by the appended independent claims.

The invention claimed is:

1. A method for scheduling a decoding process of coded data blocks transmitted over a wireless link in a communication network, the method comprising:
   storing a coded, data block in a queue if all decoders of a cluster of iterative decoders are unavailable;
   decoding the coded data block in a decoder of said cluster;
   returning any of the coded data block being unsuccessfully decoded to said queue;
   combining said unsuccessfully decoded data block with a corresponding retransmitted coded data block;
   wherein a transmission between a physical layer of a stack of protocols in a communication apparatus and a physical layer of a stack of protocols in the communication network is controlled by a protocol requiring an ACK/NACK-report of the transmission within a predetermined time limit; and
   wherein the NACK-report is transmitted to a transmitter of the data block if the time limit is reached before the stored data block is moved to any of the decoders of the cluster.

2. The method according to claim 1, wherein the iterative decoders of the cluster are arranged in parallel.

3. The method according to claim 1, wherein the ACK report is transmitted to the transmitter of the data block if said block is successfully decoded in any of the decoders of the cluster within the time limit.

4. The method according to claim 3, wherein the NACK report is transmitted to the transmitter of the data block if said block is unsuccessfully decoded in any of the decoders of the cluster within the time limit.

5. The method according to claim 4, wherein the NACK report is transmitted to the transmitter of the data block if the decoding of said block in any of the decoders of the cluster is not finished within the time limit.

6. The method according to claim 5 wherein the data block is moved into the end of the queue.

7. The method according to claim 6, wherein the data block being unsuccessfully decoded is combined with a retransmitted data block to a combined data block and stored in the queue.

8. The method according to claim 7, wherein the combined data block is processed.

9. The method according to claim 8, wherein the data blocks are moved from the queue to any of the decoders of the cluster according to a First In First Out (FIFO) principle.

10. The method according to claim 8, wherein the data blocks are moved from the queue to any of the decoders of the cluster according to an "oldest data block first" principle.

11. The method according to claim 10, wherein a maximum number of iterations in a certain decoder of said cluster is adapted automatically by a CPU.

12. The method according to claim 11, wherein the maximum number of iterations is adapted in dependence on the number of blocks being moved directly from a beginning to the end of the queue.

13. The method according to claim 12, wherein the maximum number of iterations is adapted in dependence on whether the a coded data block to be decoded for a first time or a combined data block is received by said decoder.

14. The method according to claim 13, wherein the decoders are activated automatically by the CPU when a bitrate of a received stream of data blocks reaches certain predefined levels.

15. The method according to claim 14, wherein the decoding process of any of the decoders of the cluster is terminated before a maximum number of iterations is reached.

16. The method according to claim 15, wherein the coded data blocks are received according to a HARQ (Hybrid ARQ) protocol.

17. An electronic communication apparatus capable of decoding coded data blocks received over a wireless link in a communication network, the apparatus comprising;
   a queue, which is adapted for temporarily storing the coded data blocks
   a cluster of decoders, which is adapted to decode the coded data blocks when any of the decoders of the cluster is available and to return to said queue any coded data block being unsuccessfully decoded by any of said decoders;
   a controller, which is adapted to combine the coded data block being unsuccessfully decoded with a corresponding retransmitted coded data block;
   wherein said apparatus is adapted to receive the data blocks according to a protocol requiring a ACK/NACK-report within a predetermined time limit; and wherein said apparatus is adapted for transmitting the NACK-report to a transmitter of the data block if said block is not moved to any of the decoders of the cluster within the time limit.

18. The electronic communication apparatus according to claim 17, wherein the decoders of the cluster are arranged in parallel.

19. The electronic communication apparatus according to claim 18, wherein said apparatus comprises a receiver, which is adapted for receiving the data blocks with a bitrate of up to at least 15 Mbps.

20. The electronic communication apparatus according to claim 18, wherein said apparatus comprises a receiver, which is arranged to receive the coded data blocks according to a HARQ protocol.

21. The electronic communication apparatus according to claim 17, wherein said apparatus is adapted for transmitting the ACK-report to the transmitter of the data block if said block is unsuccessfully decoded in any of the decoders of the cluster within the time limit.

22. The electronic communication apparatus according to claim 21, wherein said apparatus is adapted for transmitting the a NACK-report to the transmitter of the data block if said block is unsuccessfully decoded in any of the decoders of the cluster within the time limit.

23. The electronic communication apparatus according to claim 22, wherein said apparatus is adapted for transmitting the NACK-report to the transmitter of the data block if the decoding of said block in any of the decoders of the cluster can not be finished within the time limit.

24. The electronic communication apparatus according to claim 23, wherein said apparatus further comprises: feedback loops between a beginning of the queue and an end of the queue, and between the cluster of decoders and the end of the queue; and wherein said apparatus is adapted for moving the data block to the end of the queue when the decoding is not initiated or successfully completed.

25. The electronic communication apparatus according to claim 24, wherein said apparatus is adapted for receiving a retransmitted data block, combining the retransmitted data block with a stored data block to a combined data block, and storing the combined data block.

26. The electronic communication apparatus according to claim 25, wherein said apparatus is adapted to process the combined data block.

27. The electronic communication apparatus according to claim 26, wherein the queue is provided as a rewritable memory.

28. The electronic communication apparatus according to claim 27, wherein a controller of the apparatus is arranged to automatically adapt the number of active decoders when the bitrates of the received stream of data blocks reaches certain predefined levels.

29. The electronic communication apparatus according to claim 28, wherein the controller is arranged to adapt the maximum number of iterations of a certain decoder in dependence on the number of blocks being moved directly from the beginning to the end of the queue.

30. The electronic communication apparatus according to claim 29, wherein the controller is arranged to adapt the maximum number of iterations of a certain decoder in dependence on whether a coded data block to be decoded for the first time or the combined data block is received by said decoder.

31. The electronic communication apparatus according to claim 30, wherein the apparatus is further adapted to move the data blocks from the queue to any of the decoders of the cluster according to a First In First Out (FIFO) principle.

32. The electronic communication apparatus according to claim 31, wherein the apparatus is further adapted to move the data blocks from the queue to any of the decoders of the cluster according to an "oldest data block first" principle.

33. The electronic communication apparatus according to claim 32, wherein the controller is arranged to terminate the decoding process of any of the decoders of the cluster before a maximum number of iterations are reached.

34. The electronic communication apparatus according to claim 33, wherein said apparatus is one selected from the group consisting of a mobile telephone, a communicator, an electronic organizer, or a smartphone.

* * * * *